United States Patent
Kojima (10) Patent No.: US 7,365,541 B2
(45) Date of Patent: Apr. 29, 2008

(54) MRI APPARATUS WHICH AUTOMATICALLY DETERMINES AND DISPLAYS OPERATING INSTRUCTIONS

(75) Inventor: Fumitoshi Kojima, Otawara (JP)

(73) Assignees: Kabushiki Kaisha Toshiba, Tokyo (JP); Toshiba Medical Systems Corporation, Tochigi (JP)

( * ) Notice: Subject to any disclaimer, the term of this patent is extended or adjusted under 35 U.S.C. 154(b) by 0 days.

(21) Appl. No.: 11/292,348

(22) Filed: Dec. 2, 2005

(65) Prior Publication Data

US 2007/0126425 A1 Jun. 7, 2007

(51) Int. Cl.
*G01V 3/00* (2006.01)
(52) U.S. Cl. ..................................... 324/318
(58) Field of Classification Search ........ 324/300–322; 600/410–435
See application file for complete search history.

(56) References Cited

U.S. PATENT DOCUMENTS 5,243,288 A * 9/1993 Mori .......................... 324/322
5,551,430 A * 9/1996 Blakeley et al. ............ 600/410
RE36,495 E * 1/2000 Blakeley et al. ............ 600/410
6,946,836 B2 * 9/2005 Kuhara ...................... 324/307
7,190,164 B2 * 3/2007 Kuhara ...................... 324/309
2007/0096739 A1* 5/2007 Nakabayashi ............... 324/318

FOREIGN PATENT DOCUMENTS

JP 2002-16825 1/2002

* cited by examiner

*Primary Examiner*—Brij Shrivastav
*Assistant Examiner*—Dixomara Vargas
(74) *Attorney, Agent, or Firm*—Nixon & Vanderhye P.C.

(57) ABSTRACT

An MRI apparatus in which a magnetic field is applied to a subject, a receiver coil attached to the subject receives a magnetic resonance signal generated in the subject, and a magnetic resonance image of the subject is generated from the magnetic resonance signal, the apparatus comprising a gantry which comprises a magnetic-field generating unit for generating the magnetic field, a determining unit which determines the type of the receiver coil, a first memory unit which stores data items representing a plurality of methods of attaching various receiver coils, each method designated for one receiver coil, and a monitor which is provided on the gantry and which displays one of the methods stored in the first memory unit, which pertains to the receiver coil whose type has been determined by the determining unit.

17 Claims, 5 Drawing Sheets

MRI APPARATUS WHICH AUTOMATICALLY DETERMINES AND DISPLAYS OPERATING INSTRUCTIONS

BACKGROUND OF THE INVENTION

1. Field of the Invention

The present invention relates to an MRI apparatus that provides tomograms of human subject by utilizing magnetic resonance.

2. Description of the Related Art

MRI apparatuses that provide tomograms of human subject by using magnetic resonance are known. Any MRI apparatus can obtain tomograms viewed from various desired directions, which have higher contrast resolution than images acquired by any other radiological checks such as simple photography and computer tomography. The MRI apparatus is advantageous in many respects. For example, no artifacts are generated from bone and air, and no X-ray exposure takes place. This is why the MRI apparatus is used to acquire tomograms of various regions of interest, such as head, knees, vertebra, limbs and breasts.

To perform tomography by using the MRI apparatus, a doctor or a medical person (hereinafter generally referred to as "medical expert") makes the subject lay on the bed and attaches a receiver coil to that part of the subject, in which the region of interest exists. The medical expert then informs the subject of a point the subject must pay attention to during the tomography. Next, the medical expert moves the bed, setting the region of interest at a specific part of the MRI apparatus. He or she operates the MRI apparatus, applying a magnetic field to the region of interest. In the region of interest, a magnetic resonance signal is generated. The receiver coil receives the magnetic resonance signal. The signal is processed, providing a tomogram of the region of interest.

There are many types of receiver coils. Each coil is designed to receive a magnetic resonance signal from a specific region of interest. It is therefore necessary to use the receiver coil that can best receive a signal from the region of interest. Further, any receiver coil must be attached to the subject by a special method. The items that require attention on the part of the subject differ from one region of interest to another. The medical expert should therefore inform the subject of the very items that the subject must be careful about while the region of interest is being photographed, in order to obtain desired tomograms of that region.

Thus, it is far more difficult to use the MRI apparatus than other medical apparatuses. Medical experts not used to operate the MRI apparatus can hardly perform the above-described procedure, both quickly and exactly.

The medical expert cannot help but refer to the manual placed in the control room, to attach the receiver coil to the subject and to inform the subject of what the subject should pay attention to during the tomography. Namely, the expert must go from the MRI room to the control room, reads the manual, and go back to the MRI room, in order to attach the coil to the subject or inform the subject of what he or she should be careful about during the tomography. It takes the medical expert much time and labor, and the work efficiency is very low.

In view of this, medical apparatuses with a monitor that displays instructions to medical experts have been developed in recent years. Such an apparatus is disclosed in, for example, Jpn. Pat. Appln. Publication No. 2002-16825. However, the monitor described in this publication is provided for training only, and medical experts still need to learn how to operate the MRI apparatus. It therefore remains a burden for them to use the MRI apparatus.

BRIEF SUMMARY OF THE INVENTION

An object of the present invention is to provide an MRI apparatus that can lessen labor on the part of the medical experts in the process of acquiring tomograms.

To achieve this object, MRI apparatuses according to the present invention are configured as follows.

(1) An MRI apparatus is of the type in which a high-frequency magnetic field and a gradient magnetic field are applied to a subject placed in a static magnetic field, a receiver coil attached to the subject receives a magnetic resonance signal generated in the subject, and a magnetic resonance image of the subject is generated from the magnetic resonance signal. The apparatus comprises: a gantry which comprises a static-magnetic-field generating unit for generating the static magnetic field, a high-frequency-magnetic-field generating unit for generating the high-frequency magnetic field and a gradient-magnetic-field generating unit for generating the gradient magnetic field; a determining unit which determines the type of the receiver coil; a first memory unit which stores data items representing a plurality of methods of attaching various receiver coils, each method designated for one receiver coil; and a monitor which is provided on the gantry and which displays one of the methods stored in the first memory unit, which pertains to the receiver coil whose type has been determined by the determining unit.

(2) In the MRI apparatus described in the paragraph (1), the monitor displays steps of the method of attaching the receiver coil, one after another.

(3) In the MRI apparatus described in the paragraph (2), the monitor automatically displays each step upon lapse of a prescribed time for which the immediately preceding step is displayed.

(4) The MRI apparatus described in the paragraph (1) may further comprise a subject memory unit for storing test information about the subject, and in which the monitor displays a message showing that the receiver coil is an inappropriate one, when the type of the receiver coil, determined by the determining unit, does not accord with the test information stored in the subject memory unit.

(5) Another MRI apparatus according to this invention is of the type in which a sensor attached to a subject detects a motion of the subject, a high-frequency magnetic field and a gradient magnetic field are applied in synchronism with the motion detected, a receiver coil attached to the subject receives a magnetic resonance signal generated in the subject, and a magnetic resonance image of the subject is generated from the magnetic resonance signal. The apparatus comprises: a gantry which comprises a static-magnetic-field generating unit for generating the static magnetic field, a high-frequency-magnetic-field generating unit for generating the high-frequency magnetic field and a gradient-magnetic-field generating unit for generating the gradient magnetic field; a first memory unit which stores test information about the subject; a second memory unit which stores data items representing a plurality of methods of attaching various sensors, each method designated for one sensor; and a monitor which is provided on the gantry and which displays one of the methods stored in the second memory unit, which pertains to the test information stored in the first memory unit.

(6) In the MRI apparatus described in the paragraph (5), the monitor displays steps of the method of attaching the sensor, one after another.

(7) In the MRI apparatus described in the paragraph (6), the monitor automatically displays each step upon lapse of a prescribed time for which the immediately preceding step is displayed.

(8) Still another MRI apparatus according to the invention is of the type in which a contrast medium is injected through a drip tube to a subject placed in a static magnetic field, a high-frequency magnetic field and a gradient magnetic field are applied to the subject, a receiver coil attached to the subject receives a magnetic resonance signal generated in the subject, and a magnetic resonance image of the subject is generated from the magnetic resonance signal. The apparatus comprises: a gantry which comprises a static-magnetic-field generating unit for generating the static magnetic field, a high-frequency-magnetic-field generating unit for generating the high-frequency magnetic field and a gradient-magnetic-field generating unit for generating the gradient magnetic field; a first memory unit which stores test information about the subject; a second memory unit which stores data items representing a plurality of methods of laying out the drip tube, each method designated for one test information; and a monitor which is provided on the gantry and which displays one of the methods stored in the second memory unit, which pertains to the test information stored in the first memory unit.

(9) In the MRI apparatus described in the paragraph (8), the monitor displays steps of the method of laying out the drip tube, one after another.

(10) In the MRI apparatus described in the paragraph (9), the monitor automatically displays each step upon lapse of a prescribed time for which the immediately preceding step is displayed.

(11) An MRI apparatus according to the present invention is of the type in which a high-frequency magnetic field and a gradient magnetic field are applied to a subject placed in a static magnetic field, a receiver coil attached to the subject receives a magnetic resonance signal generated in the subject, and a magnetic resonance image of the subject is generated from the magnetic resonance signal, the apparatus comprises: a gantry which comprises a static-magnetic-field generating unit for generating the static magnetic field, a high-frequency-magnetic-field generating unit for generating the high-frequency magnetic field and a gradient-magnetic-field generating unit for generating the gradient magnetic field; a first memory unit which stores test information about the subject; a second memory unit which stores data items representing a plurality of points that the subject should be informed of, each point designated for one test information; a monitor which is provided on the gantry and which displays one of the points stored in the second memory unit, which pertains to the test information stored in the first memory unit.

(12) In the MRI apparatus described in the paragraph (11), the monitor displays items of the point that the subject should be informed of, one after another.

(13) In the MRI apparatus described in the paragraph (12), the monitor automatically displays each item of the point upon lapse of a prescribed time for which the immediately preceding item of the point is displayed.

(14) Another MRI apparatus according to the invention is of the type in which a high-frequency magnetic field and a gradient magnetic field are applied to a subject placed in a static magnetic field, a receiver coil attached to the subject receives a magnetic resonance signal generated in the subject, and a magnetic resonance image of the subject is generated from the magnetic resonance signal, the apparatus comprises: a gantry which comprises a static-magnetic-field generating unit for generating the static magnetic field, a high-frequency-magnetic-field generating unit for generating the high-frequency magnetic field and a gradient-magnetic-field generating unit for generating the gradient magnetic field; a memory unit which stores test information about the subject; a determining unit which determines the type of the receiver coil; and a monitor which is provided on the gantry and which displays a message showing that the receiver coil is an inappropriate one, when the type of the receiver coil, determined by the determining unit, does not accord with the test information stored in the memory unit.

(15) A further MRI apparatus according to the invention is of the type in which a high-frequency magnetic field and a gradient magnetic field are applied to a subject placed in a static magnetic field, a receiver coil attached to the subject receives a magnetic resonance signal generated in the subject, and a magnetic resonance image of the subject is generated from the magnetic resonance signal, the apparatus comprises: a gantry which is installed in a first room and which comprises a static-magnetic-field generating unit for generating the static magnetic field, a high-frequency-magnetic-field generating unit for generating the high-frequency magnetic field and a gradient-magnetic-field generating unit for generating the gradient magnetic field; a console which is installed in a second room and which is operated to input test information about the subject; a first memory unit which stores the test information input at the console; a second memory unit which stores photographing information items, each item designated for one test information; a first monitor which is installed in the first room and which displays some of the photographing information items stored in the second memory unit, which accord with the test information stored in the first memory unit; and a second monitor which is installed in the second room and which displays some of the photographing information items displayed by the first monitor, which are required to perform a work in the second room.

(16) In the MRI apparatus described in the paragraph (15), the second monitor displays steps of the work, one after another.

(17) In the MRI apparatus described in the paragraph (16), the second monitor automatically displays each step upon lapse of a prescribed time for which the immediately preceding step is displayed.

The present invention can save time and labor on the part of the medical exert, in photographing a region of interest of the subject.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The first to fourth embodiments of this invention will be described, with reference to the accompanying drawings.

First Embodiment

The first embodiment will be described with reference to FIGS. 1 and 2.

[Configuration of the MRI Apparatus]

Figure 1:
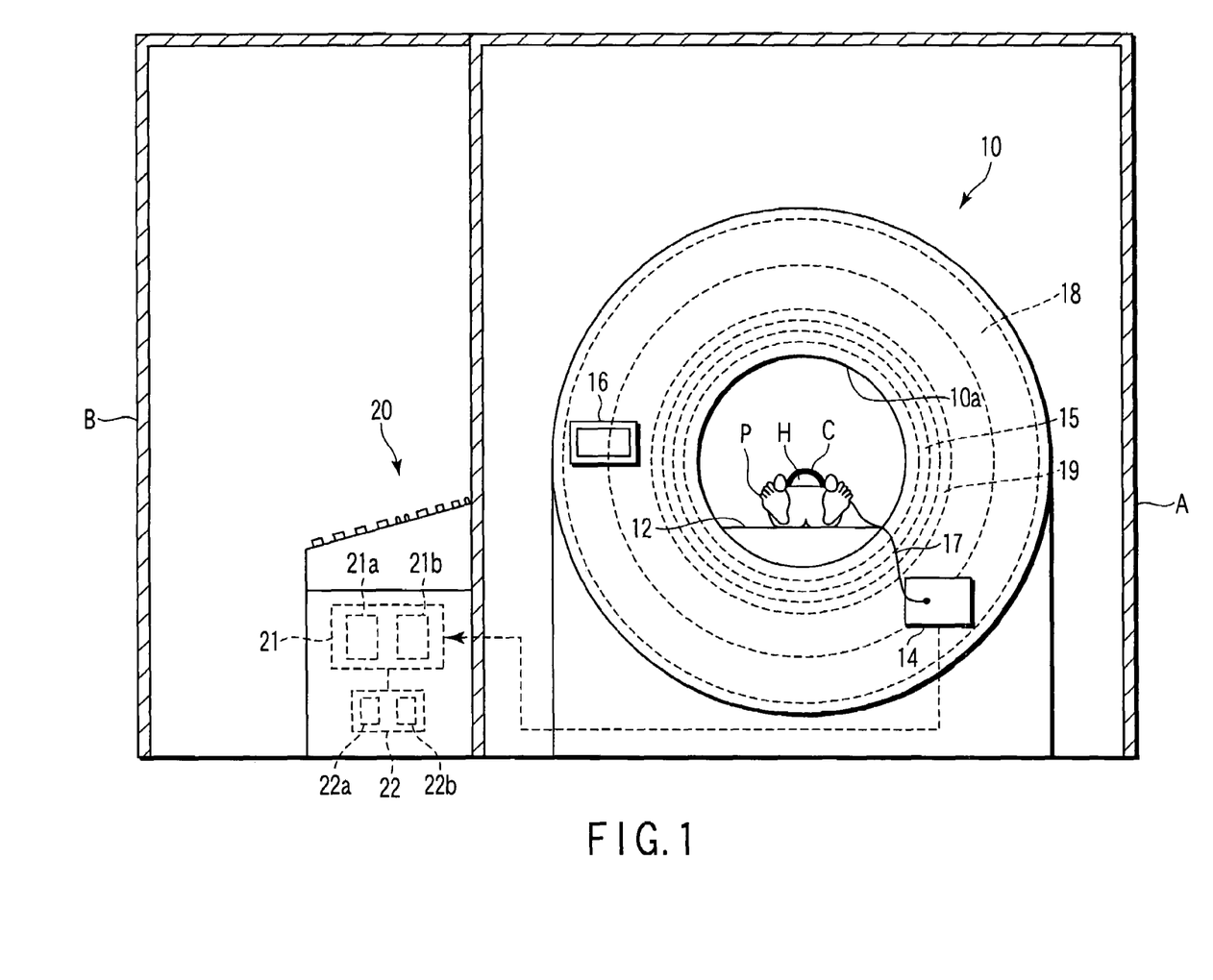
FIG. 1 is a diagram showing an MRI apparatus according to a first embodiment of the present invention.
Figure 2:
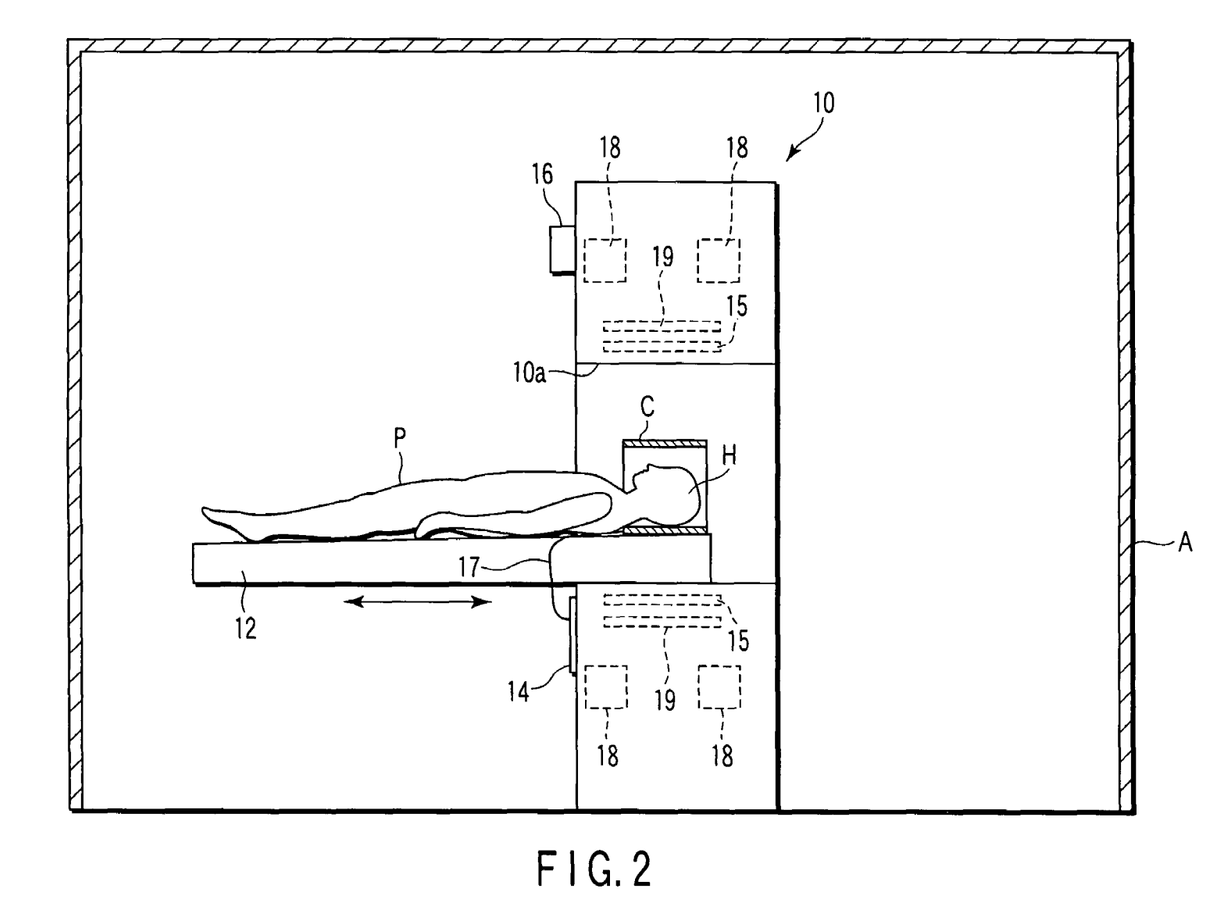
FIG. 2 is a side view of the MRI apparatus according to the first embodiment.

FIG. 1 shows the entire MRI apparatus according to the first embodiment, and FIG. 2 is a side view of this MRI apparatus.

As FIGS. 1 and 2 show, the MRI according to the first embodiment comprises a gantry 10 and a console 20. The gantry 10 is installed in a shielded room A. The console 20 is installed in a control room B.

The gantry 10 has an opening 10a. It is positioned with the axis of the opening 10a extending almost horizontally. The gantry 10 comprises a high-frequency-magnetic-field generating unit 15, a static-magnetic-field generating unit 18, and a gradient-magnetic-field generating unit 19. The unit 15 generates a high-frequency magnetic field. The unit 18 generates a static magnetic field. The unit 19 generates a gradient magnetic field. Thus, a high-frequency magnetic field, a static magnetic field and a gradient magnetic field are applied in the opening 10a of the gantry 10. Hereinafter, the three magnetic fields shall be generally called "magnetic fields."

In the opening 10a of the gantry 10, a bed 12 is provided in part. The bed 12 can be moved along the axis of the opening 10a. More precisely, a drive device (not shown) moves the bed 12 in accordance with instructions supplied from the console 20. The subject P on the bed 12 can thereby have his or her head H placed in the opening 10.

A receiver coil C has been attached to the subject's head H. The receiver coil C receives a magnetic resonance signal emanating from the subject P. The magnetic resonance signal is processed to provide a tomogram (MRI image) of the head H.

In the first embodiment, the subject's head H is the region of interest. Nonetheless, the MRI apparatus can be used to perform tomography on the other parts of body, too, such as the joints, legs, abdomen and shoulders. The receiver coil C may be replaced by one of any other type, which is fit for another region of interest. Therefore, the medical expert must attach the receiver coil C fit for the very region of interest on which he or she will perform tomography.

At prescribed part of the gantry 10, a connection panel 14 is provided, to which the wire 17 of the receiver coil C may be connected. When the wire 17 is connected to the connection panel 14, the decision unit 21a of the control device 21 incorporated in the console 20 automatically determines the type of the receiver coil C.

The magnetic resonance signal the receiver coil C has received is transmitted from the connection panel 14 to the image generating unit 21b of the control device 21. The image generating unit 21b processes the signal to provide a tomogram of the subject's head H.

A memory device 22 is connected to the control device 21. The memory device 22 comprises two memory units 22a and 22b. The first memory unit 22a stores the test information about the subject P, which has been input at the console 20. The second memory unit 22b stores information representing the methods of attaching various receiver coils C to the subject P. Note that the test information includes data items showing the name, age, weight and height of the subject P, the region of interest, the method of examining the region and the point that the subject P should be informed of.

A display monitor 16 is mounted at a specific position on the gantry 10. The display monitor 16 displays the sequence of attaching the receiver coil C to the subject P, the method of laying out the wire 17 of the receiver coil C, the point the subject P should be informed of, and the like. Looking at the screen of the display monitor 16, the medical expert can attach the receiver coil C to the subject P, lay out the wire 17 and inform the subject P of the point that requires attention.

[Sequence of Using the MRI Apparatus]

Before using the MRI apparatus of the configuration described above, the medical expert operates the console 20 installed in the control room B, inputting the test information about the subject P. Instead, the test information may be read from the ID card of the subject P.

After making the subject P lay on the bed 12, the medical expert connects the wire 17 of the receiver coil C to the connection panel 14. When the wire 17 is thus connected to the panel 14, the decision unit 21a of the control device 21 automatically determines the type of the receiver coil C. On the basis of the type of coil, thus determined, it is determined whether the receiver coil C now connected to the connection panel 14 is one fit for the test information input at the console 20. The decision made is displayed by the display monitor 16.

A receiver coil C fit for any part of body, other than the head H, may be connected to the connection panel 14, though the data input at the console 20 shows that the region of interest is the head H. In this case, the display monitor 16 displays a message informing that the receiver coil C is a wrong one. Reading this message, the medical expert disconnects the receiver coil C from the connection panel 14, and then connects the receiver coil fit for providing tomograms of the head H to the connection panel 14.

If the receiver coil C connected to the connection panel 14 is determined to be one fit for providing tomograms of the head H, the method of attaching the coil C to the subject P is selected from those stored in the second memory unit 22b. The display monitor 16 displays the method selected. Thus, the display monitor 16 displays the method of attaching the receiver coil C fit for providing tomograms of the head H, if this receiver coil C is connected to the connection panel 14.

In accordance with the method the display monitor 16 displays, the medical expert attaches the receiver coil C to the subject's head H. Every time the expert finishes performing one step of the method, he or she may pushes a button provided on the display monitor 16, causing the display monitor 16 to display the instruction about the next step of the method. Alternatively, upon lapse of a predetermined time for the instruction about any step is displayed, the display monitor display 16 automatically display the instruction about the next step.

After attaching the receiver coil C to the subject's head H, the medical expert pushes another button provided on the display monitor 16. When the button is pushed, the display monitor 16 displays the method of laying out the wire 17 of the receiver coil C. This method accords with the region of interest that has been already designated. Since the head H is the region of interest, the display monitor 16 displays the method of laying out the wire 17 of the receiver coil C attached to the subject's head H.

In accordance with the method the display monitor 16 displays, the medical expert lays out the wire 17. When the medical expert finishes laying out the wire 17 correctly, he or she pushes still another button provided on the display monitor 16. Then, the display monitor 16 displays the point the subject P should pay attention to. The point accords with the region of interest already designated, i.e., the head H. The subject should pay attention to the point while tomography is being performed on his or her head H.

The medical expert tells items of the point displayed, one by one. Every time the expert finishes explaining one item of the point to the subject P, he or she pushes the button provided on the display monitor 16, causing the display monitor 16 to display the next item of the point that requires the subject's attention. Instead, upon lapse of a predetermined time for any item of the point is displayed, the display monitor display 16 may automatically display the next item of the point.

After the receiver coil C is attached to the subject P, the wire 17 of the receiver coil C is laid out and the subject P is informed of the matter that requires attention, the bed 12 moves along the axis of the subject P until the subject's head H is placed in the opening 10*a* of the gantry 10. The medical expert then goes into the control room B. In the control room B, the expert operates the console 20, thus starting tomography on the subject's head H.

The console 20 gives instructions to the high-frequency-magnetic-field generating unit 15, static-magnetic-field generating unit 18 and gradient-magnetic-field generating unit 19. As a result, a magnetic field of a prescribed intensity is generated in the opening 10*a*. The magnetic field is applied to the subject's head H. Applied with the magnetic field, the head H generates a magnetic resonance signal. The receiver coil C receives the magnetic resonance signal, which is transmitted from the connection panel 14 to the image generating unit 21*b* of the control device 21 incorporated in the console 20. The image generating unit 21*b* performs various processes on the magnetic resonance signal, generating data representing a tomogram of the head H. This data is stored in a storage device (not shown) and will be used in diagnosing the subject's head H.

[Operation of the MRI Apparatus]

In the MRI apparatus of the configuration described above, the display monitor 16 is provided on the gantry 10 that is installed in the shielded room A. The display monitor 16 displays the sequence of attaching to the subject P the receiver coil C connected to the connection panel 14. Looking at the display monitor 16, the medical expert can attach the receiver coil C to the subject P.

The display monitor 16 displays the method of laying out the wire 17 of the receiver coil C connected to the connection panel 14. This enables the medical expert to lay out the wire 17 of the receiver coil C, while looking at the display monitor 16.

The display monitor 16 displays the point the subject P should pay attention to during the tomography to be formed on the region of interest. Reading the items of the point displayed, the medical expert can explain the items of the point to the subject P.

With the MRI apparatus according to the first embodiment, it takes the medical expert less time and labor to perform tomography on the subject than in the case where he or she needs to operate the apparatus while reading the printed manual. In addition, the medical expert can use, without fail, the receiver coil fit for providing tomograms of the region of interest. Moreover, the exert can perform tomography on any region of interest, in the best possible method.

Second Embodiment

A second embodiment of this invention will be described, with reference to FIG. 3.

Figure 3:
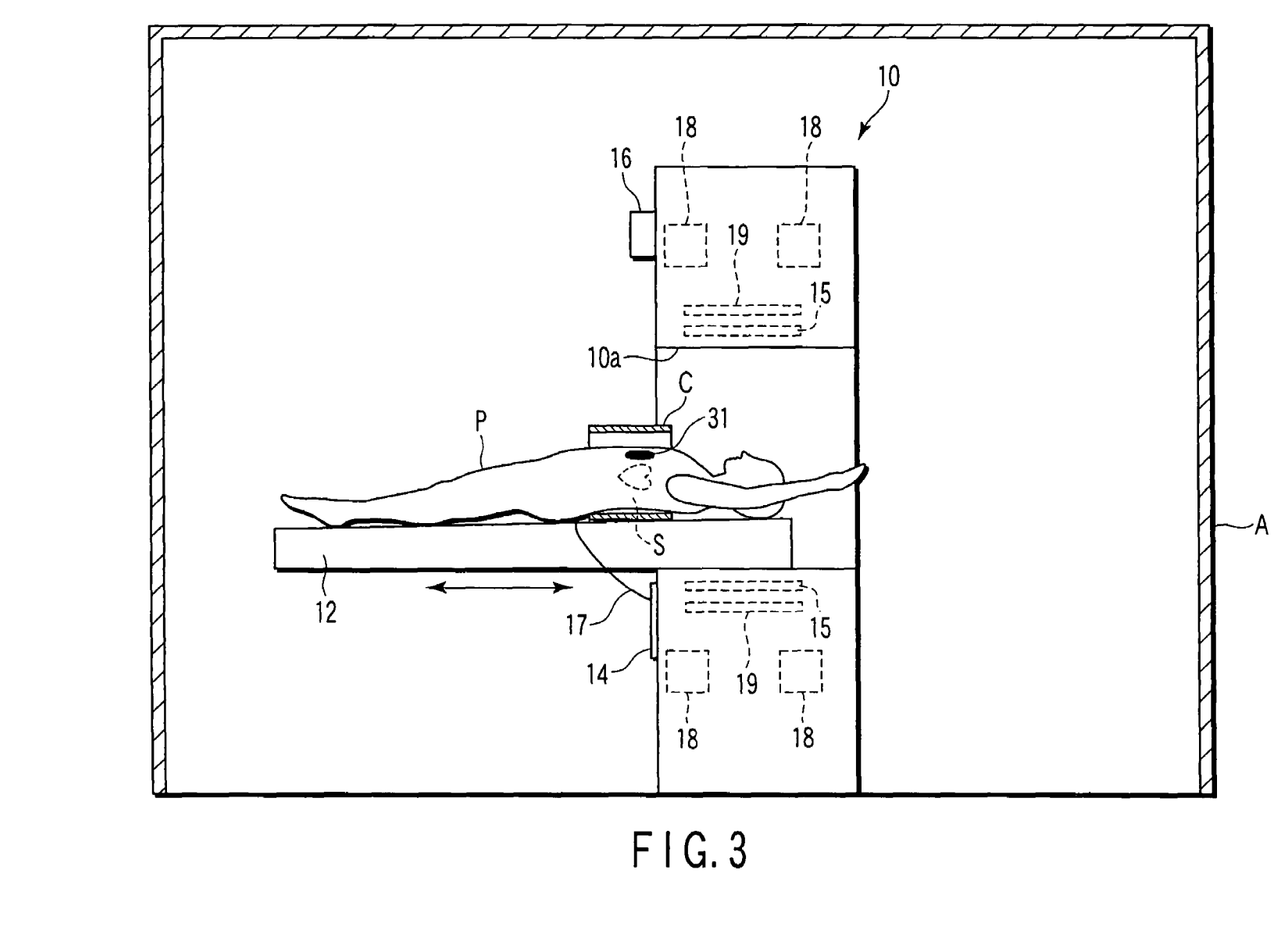
FIG. 3 is a side view of an MRI apparatus according to a second embodiment of this invention.

FIG. 3 is a side view of an MRI apparatus according to the second embodiment of this invention.

In the second embodiment, the motion of the subject's heart S, i.e., the region of interest, is detected as illustrated in FIG. 3, and tomography is carried out on the heart S in synchronism with the motion of the heat S.

The MRI apparatus is used to provide tomograms of various regions of interest. Hence, various types of sensors 31 are used, fit for providing tomograms of various regions of interest, respectively, and are attached to the subject in various methods, respectively.

In the second embodiment, the data items representing these methods of attaching the sensors 31 are stored in the second memory unit 22*b*. On the basis of the test information stored in the first memory unit 22*a*, the method best fit for providing tomograms of the region of interest is selected from those represented by the data items stored in the second memory unit 22*b*. The display monitor 16 displays the method thus selected. Every time the expert finishes performing one step of the method, he or she pushes the button provided on the display monitor 16, causing the display monitor 16 to display the instruction about the next step of the method. Otherwise, upon lapse of a predetermined time for the instruction about any step is displayed, the display monitor 16 may automatically display the instruction about the next step.

Thus, the medical expert can attach the sensor 31 to the subject P, while looking at the display monitor 16, as in the first embodiment. This saves time and labor on the part of the medical expert.

Third Embodiment

A third embodiment of the present invention will be described, with reference to FIG. 4.

Figure 4:
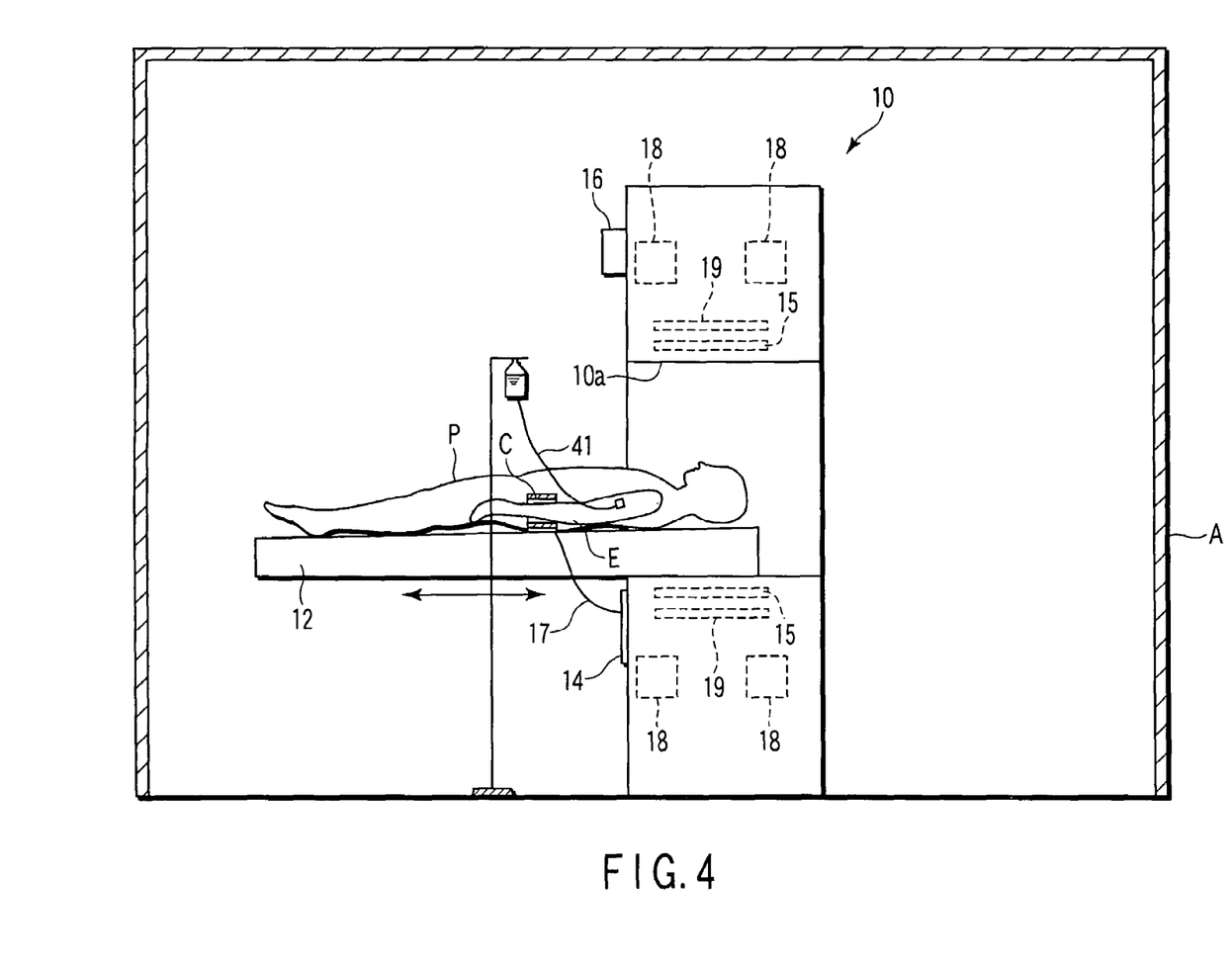
FIG. 4 is a side view of an MRI apparatus according to a third embodiment of this invention.

FIG. 4 is a side view of an MRI apparatus according to a third embodiment of this invention.

As seen from FIG. 4, tomography is performed on the subject's arm E, i.e., region of interest, while a contrast medium is being injected to the subject P.

The MRI apparatus is used to perform tomography on various regions of interest. Therefore, there are various methods of laying out a drip tube 41 for injecting the contrast medium to the subject P, each method fit to a particular region of interest. If the drip tube 41 is not appropriately laid out, it may be slip out of the subject P.

In view of this, the second memory unit 22*b* of the memory device 22 stores data items that represent various methods of laying out the drip tube 41. One of these methods, which is best for the arm F, is selected in accordance with the test information stored in the first memory unit 22a. The display monitor 16 displays the method thus selected. When the medical expert finishes performing one step of the method of laying out the drip tube 41, he or she pushes a button provided on the display monitor 16, causing the display monitor 16 to display the next step of the method of laying out the drip tube 41. Alternatively, upon lapse of a predetermined time for any step of the method of laying out the drip tube 41 is displayed, the display monitor 16 may automatically display the next step of the method of laying out the drip tube 41.

Thus, the medical expert can lay out the drip tube 41 in accordance with instructions displayed by the display monitor 16, as in the first embodiment. This saves time and labor on the part of the medical expert.

The MRI apparatus can be used to perform tomography on various regions of interest, as has been explained in conjunction with the first to third embodiments. There are many types of receiver coils C, many methods of attaching receiver coils C to the subject, each best for one region of interest, many methods of laying out the wire 17 of each receiver coil C, many methods of attaching each sensor 31 to the subject P, many methods of laying out a drip tube 41, and many points the subject P must pay attention to. Hence, the display monitor 16 installed near the subject P displays the methods of attaching the receiver coils C and sensors 31 to the subject P, the methods of laying out the wire 17 and drip tube 41, and many points the subject P must pay attention to. This is very useful to the medical expert, reducing the time and labor on the part of the expert and enabling the expert to finish tomography within a short time.

Fourth Embodiment

A fourth embodiment of this invention will be described, with reference to FIG. 5.

Figure 5:
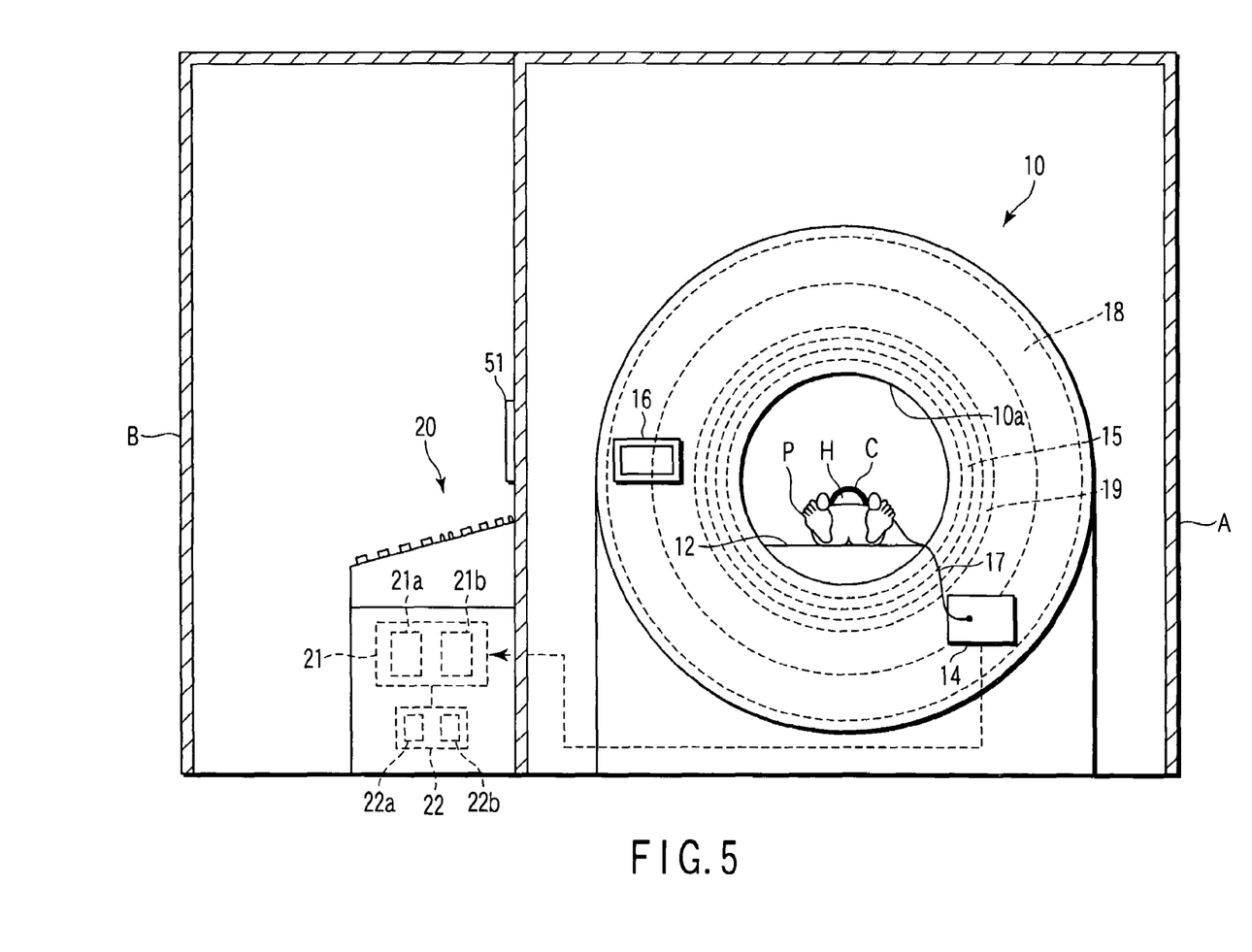
FIG. 5 is a side view of an MRI apparatus according to a fourth embodiment of the present invention.

FIG. 5 is a side view of an MRI apparatus according to the fourth embodiment.

The MRI apparatus according to the fourth embodiment differs from the MRI apparatus according to the first embodiment, only in that a control monitor 51 is provided as an additional component. The control monitor 51 is arranged in the control room B and displays the test information input at the console 20 and the photographing information designated on the basis of the test information.

The photographing information includes data items representing the type of he receiver coil C, the method of attaching the receiver coil C, the method of laying out the wire 17 of the receiver coil C, the method of laying out the drip tube 41, the point the subject P must pay attention to, the method of setting photographing parameters, and the method of processing the tomogram data.

The display monitor 16 installed in the shielded room A displays only some of the data items that the control monitor 51 displays, which pertain to the medical work performed in the shielded room A. More specifically, the display monitor 16 displays the method of attaching the receiver coil C, the method of laying out the wire 17 of the receiver coil C, the method of laying out the drip tube 41, and the point the subject P must pay attention to, and the like. Note that the display monitor 16 automatically displays data items, one after another, in accordance with the instructions coming from the console 20.

Thus, the medical expert can carry out various works in the shielded room A, while seeing the data items the display monitor 16 displays, as in the first to third embodiments. This saves time and labor on the part of the medical expert. Moreover, the medical expert can know what the display monitor 16 is displaying, while staying in the control room B, too.

The present invention is not limited to the embodiments described above. The components of any embodiment can be modified in various manners in reducing the invention to practice, without departing from the sprit or scope of the invention. Further, the components of any embodiment can be modified in various manners in reducing the invention to practice, without departing from the sprit or scope of the invention. Further, the components of any embodiment described above may be combined in various ways to make different inventions. For example, some of the component of any embodiment may not be used. Moreover, the components of the different embodiments may be combined in any fashion.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An MRI apparatus for determining and displaying operating instructions in which a high-frequency magnetic field and a gradient magnetic field are applied to a subject placed in a static magnetic field, a receiver coil attached to the subject receives a magnetic resonance signal generated in the subject, and a magnetic resonance image of the subject is generated from the magnetic resonance signal, said apparatus comprising:

a gantry which comprises a static-magnetic-field generating unit for generating the static magnetic field, a high-frequency-magnetic-field generating unit for generating the high-frequency magnetic field and a gradient-magnetic-field generating unit for generating the gradient magnetic field;

a determining unit which determines the type of the receiver coil;

a memory unit which stores data items representing a plurality of methods of attaching various receiver coils, each one of said plurality of methods being designated for a corresponding type of receiver coil; and a monitor which is provided on the gantry and which displays one of the plurality of methods stored in the memory unit which pertains to the method of attaching the receiver coil whose type has been determined by the determining unit.

2. The MRI apparatus according to claim 1, wherein the monitor displays steps of the method of attaching the receiver coil, one after another.

3. The MRI apparatus according to claim 2, wherein the monitor automatically displays each step upon lapse of a prescribed time for which the immediately preceding step is displayed.

4. The MRI apparatus according to claim 1, which further comprises a subject memory unit for storing test information about the subject, and in which the monitor displays a message showing that the receiver coil is an inappropriate one, when the type of the receiver coil, determined by the determining unit, does not accord with the test information stored in the subject memory unit.

5. An MRI apparatus for determining and displaying operating instructions in which a sensor attached to a subject detects a motion of the subject, a high-frequency magnetic field and a gradient magnetic field are applied in synchronism with the motion detected, a receiver coil attached to the subject receives a magnetic resonance signal generated in the subject, and a magnetic resonance image of the subject is generated from the magnetic resonance signal, said apparatus comprising:
   a gantry which comprises a static-magnetic-field generating unit for generating the static magnetic field, a high-frequency-magnetic-field generating unit for generating the high-frequency magnetic field and a gradient-magnetic-field generating unit for generating the gradient magnetic field;
   a first memory unit which stores test information about the subject;
   a second memory unit which stores data items representing a plurality of methods of attaching various sensors, each one of said plurality of methods being designated for a corresponding sensor; and
   a monitor which is provided on the gantry and which displays one of the plurality of methods stored in the second memory unit which pertains to the test information stored in the first memory unit.

6. The MRI apparatus according to claim 5, wherein the monitor displays steps of the method of attaching the sensor, one after another.

7. The MRI apparatus according to claim 6, wherein the monitor automatically displays each step upon lapse of a prescribed time for which the immediately preceding step is displayed.

8. An MRI apparatus for determining and displaying operating instructions in which a contrast medium is injected through a drip tube to a subject placed in a static magnetic field, a high-frequency magnetic field and a gradient magnetic field are applied to the subject, a receiver coil attached to the subject receives a magnetic resonance signal generated in the subject, and a magnetic resonance image of the subject is generated from the magnetic resonance signal, said apparatus comprising:
   a gantry which comprises a static-magnetic-field generating unit for generating the static magnetic field, a high-frequency-magnetic-field generating unit for generating the high-frequency magnetic field and a gradient-magnetic-field generating unit for generating the gradient magnetic field;
   a first memory unit which stores test information about the subject;
   a second memory unit which stores data items representing a plurality of methods of laying out the drip tube, each one of said plurality of methods being designated for a corresponding test information; and
   a monitor which is provided on the gantry and which displays one of the plurality of methods stored in the second memory unit which corresponds to the test information stored in the first memory unit.

9. The MRI apparatus according to claim 8, wherein the monitor displays steps of the method of laying out the drip tube, one after another.

10. The MRI apparatus according to claim 9, wherein the monitor automatically displays each step upon lapse of a prescribed time for which the immediately preceding step is displayed.

11. An MRI apparatus for determining and displaying operating instructions in which a high-frequency magnetic field and a gradient magnetic field are applied to a subject placed in a static magnetic field, a receiver coil attached to the subject receives a magnetic resonance signal generated in the subject, and a magnetic resonance image of the subject is generated from the magnetic resonance signal, said apparatus comprising:
   a gantry which comprises a static-magnetic-field generating unit for generating the static magnetic field, a high-frequency-magnetic-field generating unit for generating the high-frequency magnetic field and a gradient-magnetic-field generating unit for generating the gradient magnetic field;
   a first memory unit which stores test information about the subject;
   a second memory unit which stores data items representing a plurality of points that the subject should be informed of, each one of said plurality of points being designated for a corresponding test information;
   a monitor which is provided on the gantry and which displays one of the points stored in the second memory unit which corresponds to the test information stored in the first memory unit.

12. The MRI apparatus according to claim 11, wherein the monitor displays items of the point that the subject should be informed of, one after another.

13. The MRI apparatus according to claim 12, wherein the monitor automatically displays each item of the point upon lapse of a prescribed time for which the immediately preceding item of the point is displayed.

14. An MRI apparatus for determining and displaying operating instructions in which a high-frequency magnetic field and a gradient magnetic field are applied to a subject placed in a static magnetic field, a receiver coil attached to the subject receives a magnetic resonance signal generated in the subject, and a magnetic resonance image of the subject is generated from the magnetic resonance signal, said apparatus comprising:
   a gantry which comprises a static-magnetic-field generating unit for generating the static magnetic field, a high-frequency-magnetic-field generating unit for generating the high-frequency magnetic field and a gradient-magnetic-field generating unit for generating the gradient magnetic field;
   a memory unit which stores test information about the subject;
   a determining unit which determines the type of the receiver coil; and
   a monitor which is provided on the gantry and which displays a message showing that the receiver coil is an inappropriate one, when the type of the receiver coil, determined by the determining unit, does not correspond to the test information stored in the memory unit.

15. An MRI apparatus for determining and displaying operating instructions in which a high-frequency magnetic field and a gradient magnetic field are applied to a subject placed in a static magnetic field, a receiver coil attached to the subject receives a magnetic resonance signal generated in the subject, and a magnetic resonance image of the subject is generated from the magnetic resonance signal, said apparatus comprising:
   a gantry which is installed in a first room and which comprises a static-magnetic-field generating unit for generating the static magnetic field, a high-frequency-magnetic-field generating unit for generating the high-frequency magnetic field and a gradient-magnetic-field generating unit for generating the gradient magnetic field;

a console which is installed in a second room and which is operated to input test information about the subject;

a first memory unit which stores the test information input at the console;

a second memory unit which stores photographing information items, each item designated for one test information;

a first monitor which is installed in the first room and which displays some of the photographing information items stored in the second memory unit, which corresponds to the test information stored in the first memory unit; and a second monitor which is installed in the second room and which displays some of the photographing information items displayed by the first monitor which are required for performing work in the second room.

16. The MRI apparatus according to claim 15, wherein the second monitor displays steps of the work, one after another.

17. The MRI apparatus according to claim 16, wherein the second monitor automatically displays each step upon lapse of a prescribed time for which the immediately preceding step is displayed.

* * * * *